US011079425B2

(12) United States Patent
Radun et al.

(10) Patent No.: US 11,079,425 B2
(45) Date of Patent: Aug. 3, 2021

(54) METHOD AND APPARATUS FOR AN ELECTRICAL FAULT DETECTING SYSTEM FOR A CIRCUIT

(71) Applicant: GE Aviation Systems LLC, Grand Rapids, MI (US)

(72) Inventors: Arthur Vorwerk Radun, Dayton, OH (US); Adrian Shipley, Cheltenham (GB)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 15/544,524

(22) PCT Filed: Feb. 23, 2015

(86) PCT No.: PCT/US2015/017005
§ 371 (c)(1),
(2) Date: Jul. 19, 2017

(87) PCT Pub. No.: WO2016/137424
PCT Pub. Date: Sep. 1, 2016

(65) Prior Publication Data
US 2018/0017611 A1    Jan. 18, 2018

(51) Int. Cl.
*G01R 31/58*    (2020.01)
*G01R 31/14*    (2006.01)
*G01R 31/12*    (2020.01)

(52) U.S. Cl.
CPC ......... *G01R 31/14* (2013.01); *G01R 31/1263* (2013.01); *G01R 31/58* (2020.01)

(58) Field of Classification Search
CPC .......... G01R 31/14; G01R 31/021–023; G01R 31/1263–129; G01R 31/58–60; G01R 31/50–55
(Continued)

(56) References Cited

U.S. PATENT DOCUMENTS 3,781,665 A * 12/1973 Gale ...................... G01R 31/08
324/533
3,803,484 A * 4/1974 Gray ...................... G01R 31/08
324/544
(Continued)

FOREIGN PATENT DOCUMENTS

CN    102680855 A    9/2012
CN    103592577 A    2/2014
(Continued)

OTHER PUBLICATIONS

International Search Report and Written Opinion issued in connection with corresponding PCT application No. PCT/US2015/017005 dated Nov. 5, 2015.
(Continued)

*Primary Examiner* — Patrick Assouad
*Assistant Examiner* — Demetrius R Pretlow
(74) *Attorney, Agent, or Firm* — McGarry Bair PC

(57) ABSTRACT

An electrical fault detecting system (10) for a circuit includes a conductor (20) delivering an electrical signal from a source (12) to a destination (14), a sheath (22) encircling the conductor, and a fault detection circuit (18). The sheath further includes an electrical insulator layer (24) and a conductive shield (26) encircling the conductor. The fault detection circuit is configured to detect a change in the electrical characteristics of the conductor and/or conductor sheath.

20 Claims, 6 Drawing Sheets

(58) Field of Classification Search
USPC .......................................................... 324/544
See application file for complete search history.

(56) References Cited

U.S. PATENT DOCUMENTS

| | | | | |
|---|---|---|---|---|
| 4,301,399 | A | | 11/1981 | Miller et al. |
| 4,440,985 | A | * | 4/1984 | Federico ............... H04M 3/301 324/521 |
| 4,721,916 | A | * | 1/1988 | Hanasawa .......... G01R 31/1272 324/520 |
| 5,077,526 | A | * | 12/1991 | Vokey .................. G01R 31/021 324/541 |
| 5,825,850 | A | * | 10/1998 | Bren ........................ H04M 3/28 379/27.02 |
| 5,990,687 | A | | 2/1999 | Williams |
| 6,084,207 | A | * | 7/2000 | Jones .................... E04D 13/103 219/213 |
| 6,107,611 | A | * | 8/2000 | Jones .................... E04D 13/103 219/213 |
| 6,218,647 | B1 | * | 4/2001 | Jones .................... E04D 13/103 219/213 |
| 6,236,217 | B1 | * | 5/2001 | Lewis .................. G01R 31/083 324/523 |
| 6,281,685 | B1 | * | 8/2001 | Tuttle .................. G01R 31/022 324/522 |
| 6,741,081 | B1 | * | 5/2004 | Eslambolchi .......... H04B 10/07 324/509 |
| 6,909,977 | B2 | * | 6/2005 | Orton .................. H02H 1/0023 324/96 |
| 2002/0097056 | A1 | * | 7/2002 | Blades ................ G01R 1/06788 324/536 |
| 2004/0230383 | A1 | | 11/2004 | Bechhoefer et al. |
| 2004/0230385 | A1 | | 11/2004 | Bechhoefer et al. |
| 2009/0103216 | A1 | * | 4/2009 | Oldenburg ........... H02H 1/0015 361/5 |
| 2009/0112204 | A1 | * | 4/2009 | Aronow ............. A61B 18/1233 606/35 |
| 2009/0198459 | A1 | * | 8/2009 | Bilac .................... H02H 1/0015 702/58 |
| 2011/0209894 | A1 | | 9/2011 | Williams et al. |
| 2013/0241571 | A1 | * | 9/2013 | Oiwa .................. G01R 31/1272 324/543 |
| 2015/0168480 | A1 | * | 6/2015 | Robin ................. G01R 31/1272 324/551 |
| 2015/0316600 | A1 | * | 11/2015 | Davis .................... G01R 31/021 324/543 |
| 2015/0370419 | A1 | * | 12/2015 | Zhang .................... G06F 3/0482 715/716 |
| 2016/0241017 | A1 | * | 8/2016 | Schroeder ............ H02H 1/0015 |
| 2018/0231595 | A1 | * | 8/2018 | Wangemann ........ G01R 31/008 |
| 2018/0337530 | A1 | * | 11/2018 | Gariboldi ............. G01R 31/025 |

FOREIGN PATENT DOCUMENTS

| | | |
|---|---|---|
| EP | 0784210 A2 | 7/1997 |
| EP | 1477820 A2 | 11/2004 |
| JP | 1994292325 A | 10/1994 |
| JP | H06292325 A | 10/1994 |
| JP | 2005045896 A | 2/2005 |

OTHER PUBLICATIONS

Chinese Office Action issued in related Chinese patent application No. 201580076828.8, dated May 20, 2019.

* cited by examiner

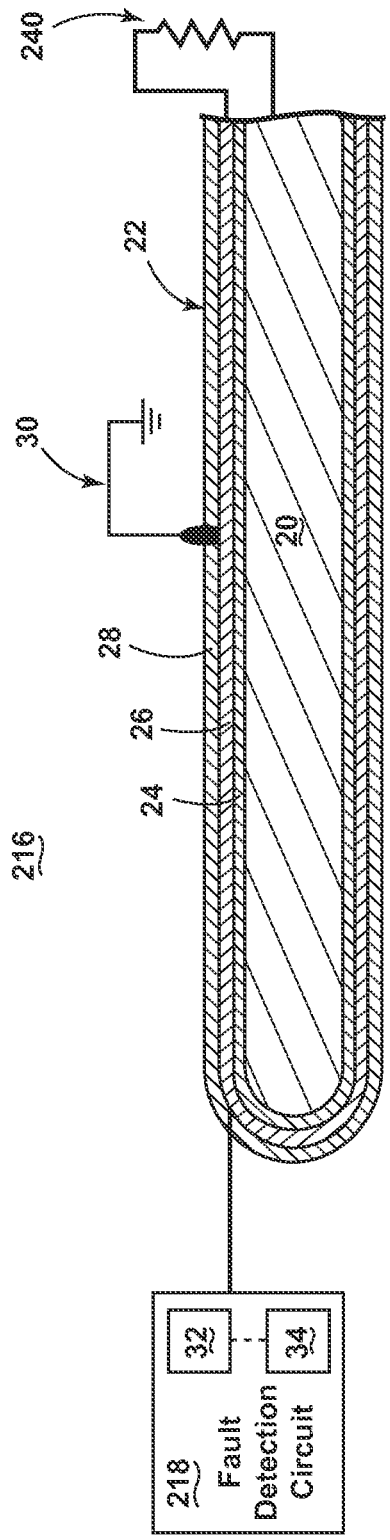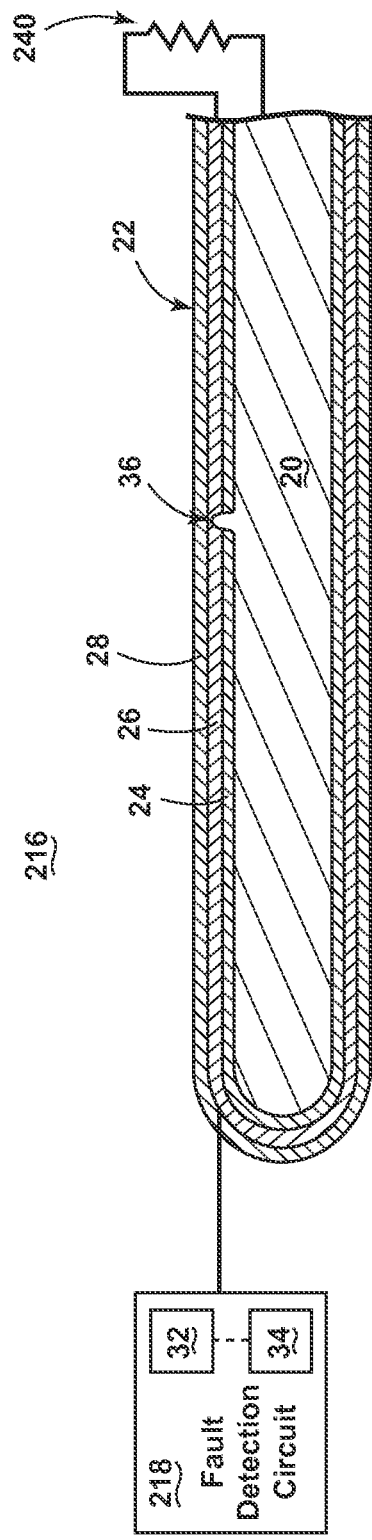

METHOD AND APPARATUS FOR AN ELECTRICAL FAULT DETECTING SYSTEM FOR A CIRCUIT

BACKGROUND OF THE INVENTION

Electrical circuits, such as those found in an aircraft and automotive power distribution system, employ electrical bus bars and miles of electrically insulated wiring for delivering power from electrical power sources to electrical loads. In the event of an electrical fault or other failure in the insulation, high currents can be transmitted through an unintended medium, such as an electrically grounded connection, another bus bar, or a normally nonconductive medium, such as air, resulting in unexpected operations of the electrical circuit. The unexpected operations of the electrical circuit can cause the circuit, or other unintentionally coupled medium, to fail.

The failure in the insulation is very difficult to locate as it can occur anywhere along the miles of wiring. The failure is further difficult to locate because it can be, for practical purposes, invisible to the human eye, especially when the failure is a small discontinuity or crack in the insulation. If the failure cannot be located, the resulting repair is typically the complete replacement of a wiring bundle or system, instead of replacement of the single failed wire.

BRIEF DESCRIPTION OF THE INVENTION

In one aspect, an electrical fault detecting system includes a conductor passing an electrical signal from a source to a destination a sheath encircling the conductor and including a conductive shield layer sandwiched between first and second electrical insulator layers, an energization source electrically coupled with the conductive shield layer and energizing the conductive shield layer, and a fault detection circuit electrically coupled with the conductive shield layer. The fault detection circuit is configured to detect a change in the electrical characteristics of the energized conductive shield layer In another aspect, an electrical fault detector for an electrical conductor, includes a sheath encircling the conductor and including a conductive shield sandwiched between first and second insulated layers, a sensor configured to electrically couple to the shield and output a signal corresponding to an electrical characteristic of electricity passing through the shield, and a controller electrically coupled to the sensor to receive the signal and having a memory in which is stored a threshold value for the sensed electrical characteristic, wherein the controller is configured to compare the signal to the threshold value and provide an indication when the comparison indicates a fault.

In yet another aspect, a method of detecting a fault in a conductor having an encircling sheath include a shield sandwiched between first and second insulation layers, the method includes sensing an electrical characteristic of electricity passing through the shield, comparing the sensed electrical characteristic to a threshold value corresponding to a fault, and providing a fault indication when the comparison indicates the presence of a fault.

BRIEF DESCRIPTION OF THE DRAWINGS

In the drawings:

FIG. 5 is a schematic cross section view of a fourth embodiment of the wiring and fault detection circuit, wherein the cable experiences an external grounding electrical fault.

FIG. 6 is a schematic cross section view of the fourth embodiment of the wiring and fault detection circuit, wherein the cable experiences having an internal electrical fault.

DESCRIPTION OF EMBODIMENTS OF THE INVENTION

The described embodiments of the present invention are directed to an electrical circuit, such as an electrical power distribution system, which can be used, for example, in an aircraft. While this description is primarily directed toward a power distribution system for an aircraft, it is also applicable to any environment using an electrical circuit that transmits power or one or more electrical signals from a source to a destination, for example, in automotive power distribution system, or alternative energy power distribution systems. Therefore, embodiments of the invention are likewise applicable to any circuit transmitting any electrical signal or signals from a source to a destination.

Figure 1:
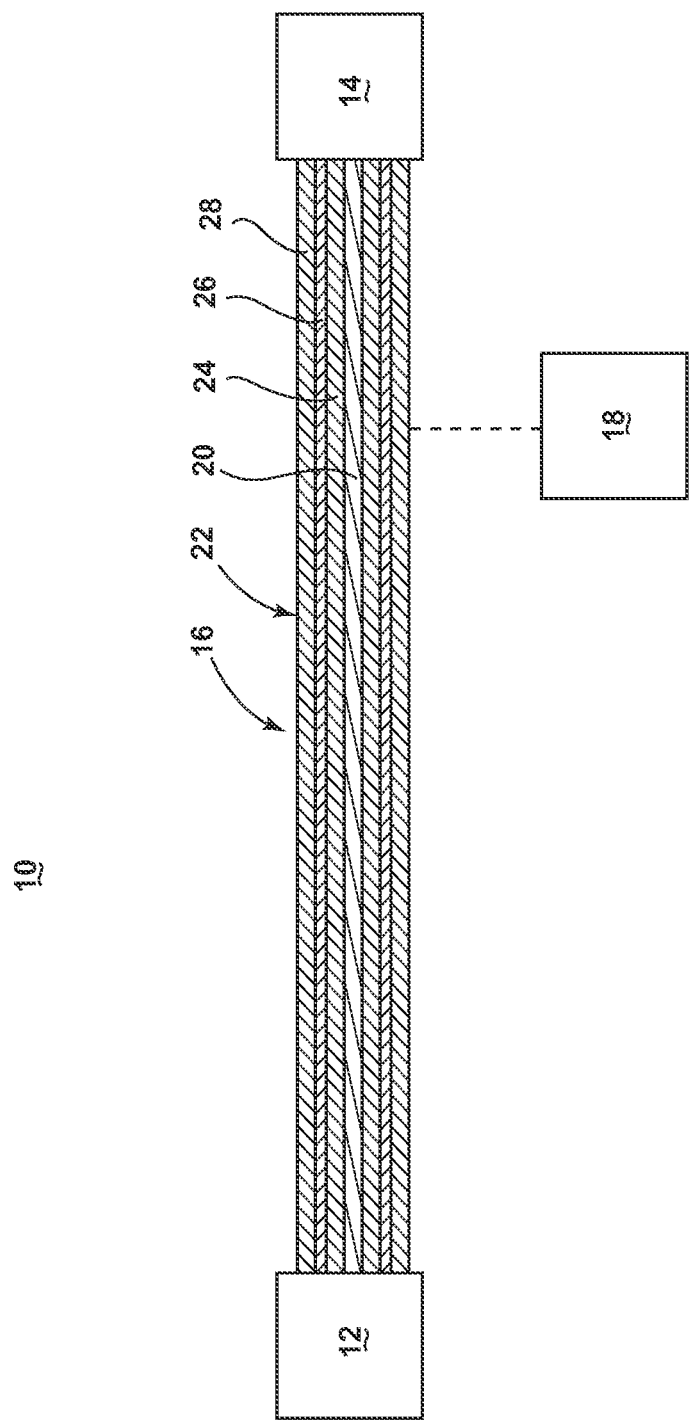
FIG. 1 is a schematic cross-section view illustrating a portion of an electrical circuit and transmission cable.

FIG. 1 illustrates an exemplary electrical fault detecting system 10 for an electrical circuit, such as an electrical power distribution system, which is suitable for use in an aircraft. The electrical fault detecting system 10 includes an electrical signal and/or power source, such as a generator 12, and an electrical signal and/or power destination, such as an electrical load 14. The generator 12 and load 14 are shown electrically coupled by a power transmission cable, such as a bus bar, or electrical wiring 16. The wiring 16 is further illustrated electrically coupled with a fault detection circuit 18.

The wiring 16 can include an electrical conductor 20 configured to transmit the electrical signal from the source to the destination, such as transmitting the power generated by the generator 12 to the electrical load 14. In the example of the electrical fault detecting system 10 for an aircraft power distribution system, the conductor 20 can be configured to transmit electrical power at, for instance 270 VDC. Additional electrical signals and or electrical power transmission characteristics can be included.

The wiring 16 can further include a sheath 22 encircling the conductor 20 and providing one or more layers of electrical insulation and/or electrical protection for the conductor 20. In the illustrated example, the sheath 22 can further include a set of sandwiched and/or enveloped layers, such as a first electrically insulator layer 24 encircling the conductor 20, an electrically conductive shield layer 26 encircling the first insulator layer 24, and a second electrically insulator layer 28 encircling the conductive shield layer 26. In the aforementioned arrangement of the sheath 22, the first insulating layer 24 can electrically isolate the conductor 20 from the conductive shield layer 26, while the second insulating layer 28 can electrically isolate the conductive shield layer 26 from other electrically conductive elements outside of the sheath 22.

The conductor 20 and conductive shield layer 26 can be made from copper, electrically conductive mesh, or any other material suitable for the purpose of conducting electricity or electrical signals. At least a portion of the conductive shield layer 26 can be electrically energized by an energization source with a current and/or voltage, or can have a known electrical resistance related to the electrical energizing of the portion, for example, to provide a reference signal. One example composition of at least one of the first and/or second insulator layers 24, 28 can include polyoxydiphenylene-pyromellitimide, electrically insulating synthetic aromatic polyamide polymer films, or, can also include any electrically insulative materials and/or coatings to prevent electrical conduction between the conductor 20 and the conductive shield layer 26 and/or the conductive shield layer 26 and any other components external to the wiring 16.

Embodiments of the invention can include, but are not limited to, any iteration and/or combination of the conductor 20, first insulator layer 24, conductive shield layer 26, and second insulator layer 28 materials described herein. For example, while the first insulator layer 24 and second insulator layer 28 are illustrated having the same cross section, dissimilar materials can be utilized. Furthermore, any of the aforementioned layers 20, 24, 26, 28 can be selectively, temporarily, and/or permanently bonded together to form a composite layer and/or material. In yet another example embodiment of the invention, any of the aforementioned layers 20, 24, 26, 28 can be formed from flexible and/or stiff materials to provide for an overall flexible or stiff wiring 16, as configured and/or needed for particular circuit applications.

The electrical fault detecting system 10 is suitable for detecting when there is a failure in the second insulator layer 28, which electrically exposes the conductive shield layer 26 to the surrounding environment. Such a failure condition is illustrated in a second embodiment of the invention, shown in FIG. 2 where the insulator failure is illustrated as the ground connection 30. The second embodiment is similar to the first embodiment; therefore, like parts will be identified with like numerals, with it being understood that the description of the like parts of the first embodiment applies to the second embodiment, unless otherwise noted. The ground connection 30 can be formed by any discontinuity in the second insulator layer 28 that electrically exposes at least a portion of the conductive shield layer 26 to an electrically grounded external component. Such discontinuities of the second insulator layer 28 can form from single, occasional, and/or continual cracking, tearing, and/or abrasion of the second insulator layer 28 when exposed to the external environment or external components, such as mounts and/or brackets. While the described discontinuities in the second insulator layer 28 cannot expose the voltage and/or current traversing the conductor 20 to the external environment, such discontinuities are nonetheless undesirable, and can indicate further discontinuities, insulator breakdown, and/or electrical faults are imminent and/or forthcoming.

Figure 2:
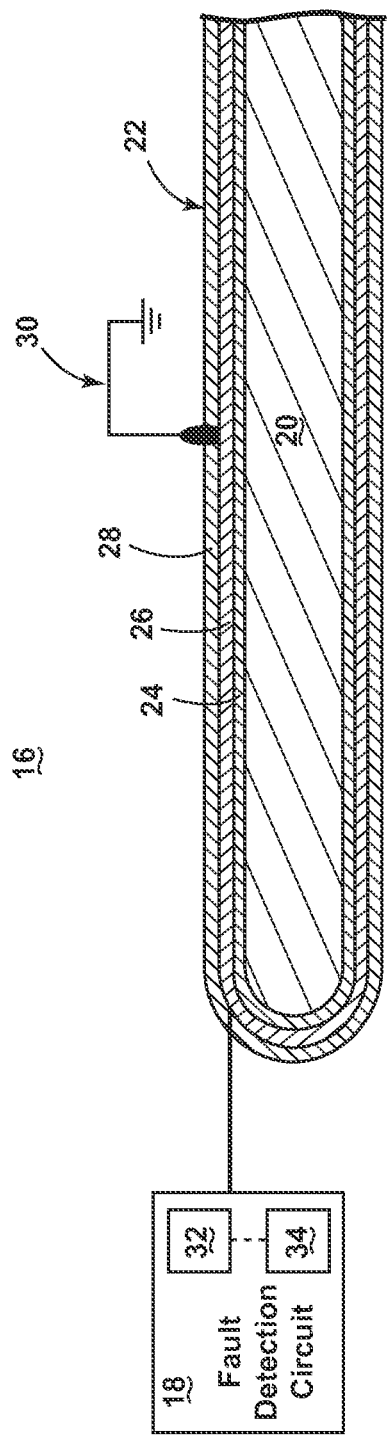
FIG. 2 is a schematic cross section view of a second embodiment of the wiring and fault detection circuit, wherein the cable experiences an external grounding electrical fault.

For the second embodiment of FIG. 2, the fault detection circuit 18 can further include, but is not limited to, a sensor 32 electrically coupled with the conductive shield layer 26 and configured to sense and/or measure the electrical characteristics of the coupled conductive shield layer 26, and/or a controller 34 that can, for example, provide comparisons of values sensed and/or measured by the sensor 32, as well as provide indications and/or control additional functions in response to the comparison indicating a fault. In one example, the electrical characteristics of the conductive shield layer 26 can be related to the reference signal provided by the energization source.

As shown, the sensor 32 is communicatively coupled with the controller 34. Examples of the sensor 32 can include any combination of an ohmmeter, a current sensor, and/or a voltage sensor. The sensor 32 can further communicate the electrical characteristic sensed and/or measured to the controller 34 for further processing. Embodiments of the sensor 32 can include, but are not limited to configurations wherein the sensor 32 communicates a preprocessed output to the controller 34. For example, the sensor 32 can be configured to communicate at least partially preprocessed values to the controller 34, including, but not limited to, the absolute characteristic value, change in characteristic value, or provide indication that the sensed value is above/below a characteristic threshold value, and/or outside a characteristic threshold value range, or otherwise indicates the presence of a fault. Alternatively, the controller 34 can include, but is not limited to, one or more reference threshold values, threshold value ranges, and/or predetermined threshold values or ranges, which the controller 34 can compare with the sensed electrical characteristics received from the sensor 32. For example, the controller 34 can include, compute, and or store in controller memory a resistance, current, and/or voltage threshold, or a resistance, current, and/or voltage threshold range.

Example electrical current characteristics measurable can include, but are not limited to, instantaneous current/voltage, average current, or rate of change in current. Likewise, example voltage characteristics measurable can include, but are not limited to, instantaneous voltage, average voltage, or rate of change in voltage. While the sensor 32 is described as "sensing" and/or "measuring" the respective electrical characteristics, embodiments of the invention can include sensing and/or measuring wherein the determination of a value indicative or related to the electrical characteristics, and not the actual values. Additionally, an alternative configuration can be included, but is not limited to, wherein the sensor 32 can be integrated with the controller 34.

In one example, the fault detector circuit 18 can be configured to energize the conductive shield layer 26 and detect a sheath 22 ground fault and/or breakdown 30 of the second insulator layer 28 when the sensor 32, such as a voltage sensor, senses a change in the voltage characteristic of the energized conductive shield layer 26 when the conductive shield layer 26 voltage equals and/or approaches a grounded voltage (e.g. at or near zero volts). In this example, the fault detector circuit 18 can include the energization source to energize the conductive shield layer 26, by applying a reference signal including, but not limited to, a known voltage to the shield layer 26. The controller 34 can then compare the sensed electrical characteristic received from the sensor 32 with one or more threshold values to determine if the sensed characteristic satisfies one or more of the threshold values. As used herein, the term "satisfies" the threshold is used to mean that the sensed value satisfies the respective threshold, such as being equal to or less than the threshold value. It will be understood that such a determination can easily be altered to be satisfied by a positive/negative comparison or a true/false comparison. In response to any determination that the comparison satisfies a threshold, the fault detection circuit 18 can, for example, log the fault and/or error to an error logging system, including indicating details and location of the error, or provide a control mechanism to cease transmission of the electrical signal and/or power transmission, or even reroute the electrical signal and/or power transmission via an alternative conductive pathway (without electrical faults), if available.

In another example, the fault detector circuit 18 can be configured to energize the conductive shield layer 26 and detect a sheath 22 ground fault and/or breakdown 30 of the second insulator layer 28 when the sensor 32, such as a current sensor, senses a change in the current characteristic of the energized conductive shield layer 26. The controller 34 can then compare the sensed electrical characteristic received, for example, as a signal from the sensor 32, with one or more threshold values to determine if the sensed characteristic satisfies one or more of the threshold values. As explained above, the fault detection circuit 18 can, perform a number of responsive actions and/or tasks in response to any determination that the comparison satisfies a threshold.

Figure 3:
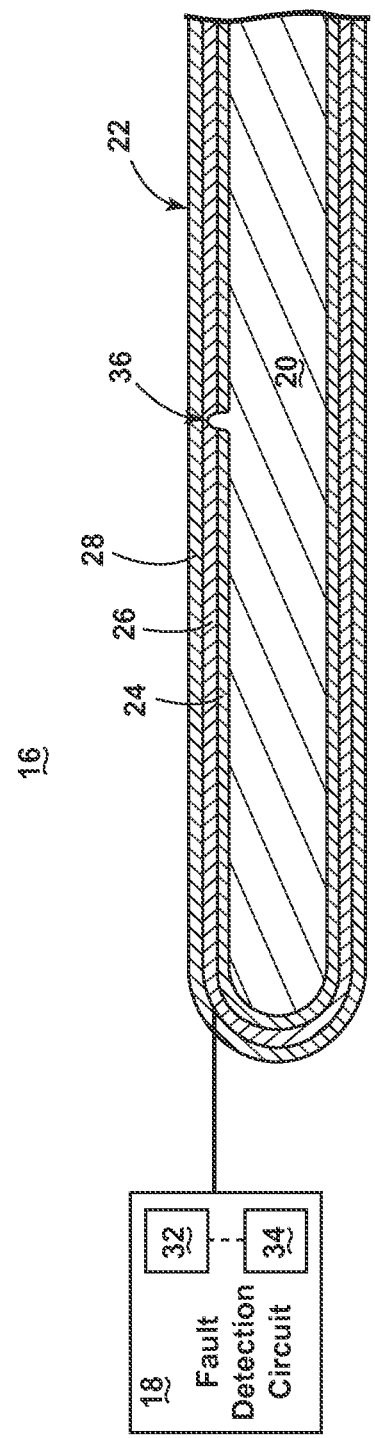
FIG. 3 is a schematic cross section view of the second embodiment of the wiring and fault detection circuit, wherein the cable experiences an internal electrical fault.

FIG. 3 illustrates another electrical fault instance of the second embodiment of the invention, wherein for illustrative purposes, a portion of the wiring 16 is further shown having an insulator breakdown 36 and/or electrical fault, wherein a discontinuity in the first insulator layer 24 has exposed at least a portion of the conductive shield layer 26 to the conductor 20. In this example, the described discontinuities in the first insulator layer 24 can expose the voltage and/or current traversing the conductor 20 to the conductive shield layer 26. While the described discontinuities in the first insulator layer 24 cannot expose the voltage and/or current traversing the conductor 20 to the external environment, such discontinuities are nonetheless undesirable, and can indicate further discontinuities, insulator breakdown, and/or electrical faults are imminent and/or forthcoming.

In the alternative fault example shown in FIG. 3, the fault detection circuit 18, by way of the electrical coupling between the circuit 18 and the conductive shield layer 26, can be configured to energize the conductive shield layer 26 and detect a change in the electrical characteristics of the electricity passing through the conductive shield layer 26. For example, the fault detector circuit 18 can be configured to detect a sheath 22 electrical fault and/or insulator breakdown 36 of the first insulator layer 24 when the sensor 32, such as a voltage sensor, senses a change in the voltage characteristic of the conductive shield layer 26 when the conductive shield layer 26 voltage equals and/or approaches the voltage of the conductor 20. The controller 34 can then compare the sensed electrical characteristic received from the sensor 32 with one or more threshold values to determine if the sensed characteristic satisfies one or more of the threshold values. As explained above, the fault detection circuit 18 can perform a number of responsive actions and/or tasks in response to any determination that the comparison satisfies a threshold.

Figure 4:
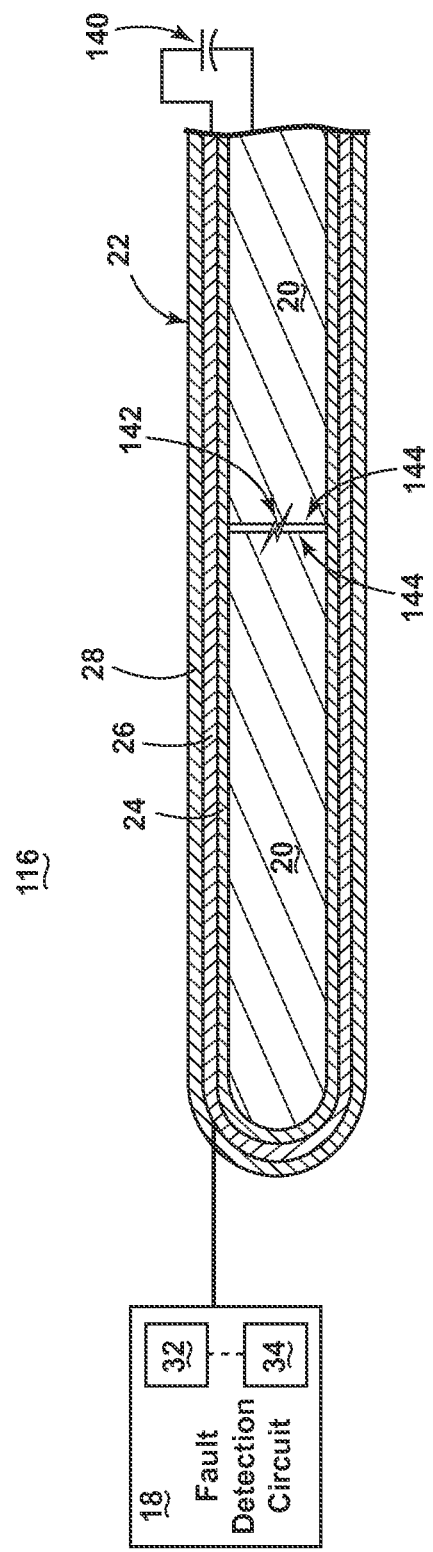
FIG. 4 is a schematic cross section view of a third embodiment of the wiring and fault detection circuit, wherein the cable experiences an internal arcing electrical fault.

FIG. 4 illustrates an alternative electrical fault detecting system 10 for an electrical circuit according to a third embodiment of the invention. The third embodiment is similar to the first and second embodiments; therefore, like parts will be identified with like numerals increased by 100, with it being understood that the description of the like parts of the first and second embodiments applies to the third embodiment, unless otherwise noted. A difference between the prior embodiments and the third embodiment is that the wiring 116 further includes a capacitor 140 electrically coupling the conductor 20 with the conductive shield layer 26 at a position away from the fault detection circuit 18.

In this sense, FIG. 4 illustrates an energization source in the form of the conductor 20 electrically coupled with the conductive shield layer 26 via a capacitor 140, which can energize the conductive shield layer 26 by passing at least a portion of a reference signal, for example, a power signal such as a voltage, from the conductor 20 to the conductive shield layer 26. The reference electrical signal can be sent along the conductive shield layer 26 such that the sensor 32 senses the actual shield layer 26 signal and the controller 34 compares the actual shield layer 26 signal to the reference signal. If there is a fault in the wiring, the fault will alter the reference signal and the sensed actual shield layer 26 signal will be different from the reference signal. This difference can be determined by the controller 34. One non-limiting example of the capacitor 140 can include a high frequency coupling capacitor, such that a DC voltage can be blocked from passing through the capacitor 140 while still allowing and/or passing a high frequency signal. For illustrative purposes, a portion of the wiring 116 is further shown having an electrical arc fault 142 in the conductor 20, wherein the arc fault 142 is physically located between the fault detection circuit 18 and the capacitor 140.

Electrical arcs faults 142 can occur in an environment where, for example, a physical defect or discontinuity in an electrical connection, such as the conductor 20, cause a permanent or temporary loss in signal and/or power transmission capabilities of the conductor 20. Where a physical separation occurs, the voltage difference between the separated conductor terminals 144 in addition to a short distance of separation, can allow for an electrical arc to strike between the terminals 144. The electrical system can see the electrical arcing event as a sudden or short current reduction, caused by the voltage drop across the terminals 144. In an environment with vibrations, for instance, as an aircraft, a physical defect in an electrical connection can cause temporary arcing events as the vibrations can reconnect and disconnect the electrical terminals 144 at the point of the physical defect. The temporary arcing events can, for example, generate a high frequency signal on the conductor, which will pass through the capacitor 140.

In the alternative arcing fault 142 example shown in FIG. 4, the fault detection circuit 18, by way of the electrical coupling between the circuit 18 and the conductive shield layer 26, can be configured to detect a change in the electrical characteristics of the electricity passing through the conductive shield layer 26. For example, the fault detector circuit 18 can be configured to detect a series arcing fault 142 between the circuit 18 and the capacitor 140 when the sensor 32, such as a voltage and/or current sensor, senses a high frequency change in the respective voltage and/or current characteristic of the conductive shield layer 26 indicative of a series arcing fault 142. The controller 34 can then compare the sensed high frequency electrical characteristic received from the sensor 32 with one or more high frequency threshold values to determine if the sensed characteristic satisfies one or more of the threshold values. As explained above, the fault detection circuit 18 can perform a number of responsive actions and/or tasks in response to any determination that the comparison satisfies a threshold.

FIG. 5 illustrates an alternative fault detector for an electrical circuit according to a fourth embodiment of the invention. The fourth embodiment is similar to the first, second, and third embodiments; therefore, like parts will be identified with like numerals increased by 200, with it being understood that the descriptions of the like parts of the first, second, and third embodiments apply to the fourth embodiment, unless otherwise noted. A difference between the previous embodiment and the fourth embodiment is that the wiring 216 further includes a resistive element, or resistor 240, electrically coupling the conductor 20 with the conductive shield layer 26 at a position away from the fault detection circuit 218. In this sense, FIG. 5 illustrates an energization source in the form of the conductor 20 electrically coupled with the conductive shield layer 26 via a resistor 240, which can energize the conductive shield layer 26 to provide the reference signal from the electrical signal transmitted by the conductor 20. Another difference between the previous embodiment and the fourth embodiment is that the fault detection circuit 218 is further electrically coupled with the conductor 20. One non-limiting example of the resistor 240 can include a high resistance resistor, such as on the order of 10 KiloOhms in order to limit the current that can traverse the resistor 240, and consequently, the conductive shield layer 26. For illustrative purposes, a portion of the wiring 216 is further shown having an insulator breakdown 30 and/or ground fault, wherein a discontinuity in the second insulator layer 28 has exposed at least a portion of the conductive shield layer 26 to an electrically grounded external component.

The fault detection circuit 218, by way of the electrical coupling between the circuit 218 and the conductive shield layer 26 and between the circuit 218 and the conductor 20, can be configured to detect a change in the electrical characteristics of the electricity passing through the conductive shield layer 26. For example, in the current configuration, the conductive shield layer 26 can be electrically energized with a current and/or voltage from being couple with the conductor 20, or can have a known electrical resistance related to an electrical energizing, such that an insulator breakdown 30 located between the fault detection circuit 218 and the resistor 240 generates a change in the electrical characteristics of the electricity passing through the conductive shield layer 26.

In one example, the fault detector circuit 218 can be configured to detect a sheath 22 ground fault and/or breakdown 30 of the second insulator layer 28, located between the fault detection circuit 218 and the resistor 240, when the sensor 32, such as a voltage sensor, senses a change in the voltage characteristic of the conductive shield layer 26 and/or conductor 20 when the sensed voltage equals and/or approaches a grounded voltage (e.g. at or near zero volts). The controller 34 can then compare the sensed voltage characteristic received from the sensor 32 with one or more threshold values to determine if the sensed voltage characteristic satisfies one or more of the threshold values. In another non-limiting example, a current sensor can sense a change in the current characteristic, such as a sudden surge in current due to the ground fault, which can be compared, by the controller 34, with one or more threshold values to determine if the sensed current characteristic satisfies one or more of the threshold values. As explained above, the fault detection circuit 218 can perform a number of responsive actions and/or tasks in response to any determination that the comparison satisfies a threshold.

FIG. 6 illustrates another electrical fault instance according to the fourth embodiment of the invention wherein for illustrative purposes, a portion of the wiring 216 is further shown having an or insulator breakdown 36 of the first insulator layer 24 and/or electrical fault, wherein a discontinuity in the first insulator layer 24 has exposed at least a portion of the conductive shield layer 26 to the conductor 20. In this example, the described discontinuities in the first insulator layer 24 can expose the voltage and/or current traversing the conductor 20 to the conductive shield layer 26.

In one example, the fault detector circuit 218, by way of the electrical coupling between the circuit 218 and the conductive shield layer 26, and between the circuit 218 and the conductor 20, can be configured to detect an insulator breakdown 36 of the first insulator layer 24, located between the fault detection circuit 218 and the resistor 240. The fault detection circuit 218 can detect an insulator breakdown 36 of the first insulator layer 24 when the sensor 32, such as a voltage sensor, senses a change in the voltage characteristic of the conductive shield layer 26 when the conductive shield layer 26 voltage equals and/or approaches the voltage of the conductor 20. The controller 34 can then compare the sensed voltage characteristic received from the sensor 32 with one or more threshold values to determine if the sensed voltage characteristic satisfies one or more of the threshold values. As explained above, the fault detection circuit 218 can perform a number of responsive actions and/or tasks in response to any determination that the comparison satisfies a threshold.

Figure 7:
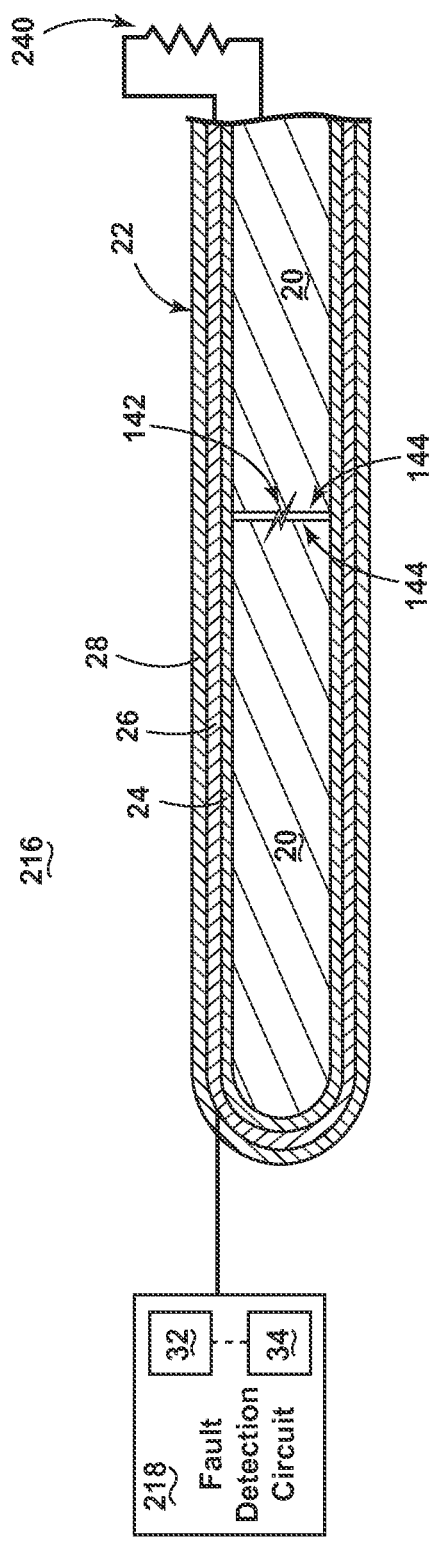
FIG. 7 is a schematic cross section view of the fourth embodiment of the wiring and fault detection circuit, wherein the cable experiences an internal arcing electrical fault.

FIG. 7 illustrates an alternative fault detector for an electrical circuit according to the fourth embodiment of the invention, wherein for illustrative purposes, a portion of the wiring 216 is further shown having an electrical arc fault 142 in the conductor 20, wherein the arc fault 142 is physically located between the fault detection circuit 218 and the resistor 240.

In this alternative arcing fault 142 example, the fault detection circuit 218, by way of the electrical coupling between the circuit 18 and the conductive shield layer 26, and between the circuit 218 and the conductor 20, can be configured to detect a change in the electrical characteristics of the electricity passing through the conductive shield layer 26 and/or the conductor 20. For example, the fault detector circuit 18 can be configured to detect a series arcing fault 142 between the circuit 218 and the resistor 240 when the sensor 32, such as a voltage and/or current sensor, senses a high frequency change in the respective voltage and/or current characteristic of the conductive shield layer 26, or when the discontinuity of the conductor 20 causes current to cease flowing, indicating a series arcing fault 142. The controller 34 can then compare the sensed electrical characteristic received from the sensor 32 with one or more characteristic threshold values to determine if the sensed characteristic satisfies one or more of the threshold values. As explained above, the fault detection circuit 18 can perform a number of responsive actions and/or tasks in response to any determination that the comparison satisfies a threshold.

While a series arcing fault 142 has been illustrated wherein a single conductor 20 has separated, resulting in a fault 142 in the relative direction of the axial length of the conductor 20, embodiments of the invention can be applied to the detection of one or more series arcing faults 142 occurring in a substantially perpendicular direction, relative to the axial length of the conductor. One example of a series arcing fault that can occur in a substantially perpendicular direction can include, but is not limited to, a bolted conductor 20 connection wherein at least two conductors 20 are at least partially axially-overlaid and are electrically coupled together by a mechanical fastener, such as a bolt. In this example, should the mechanical fastener loosen, the overlaid conductors 20 can separate such that a series arcing fault can occur. Moreover, embodiments of the invention may include an additional conductive shield layers 26 encircling, and electrically insulated from, the first conductive shield layer 26, in order to provide a second fault detecting system 10, or in order to provide a fault detecting system 10 capable of detecting different faults on the same conductor 20.

Figure 8:
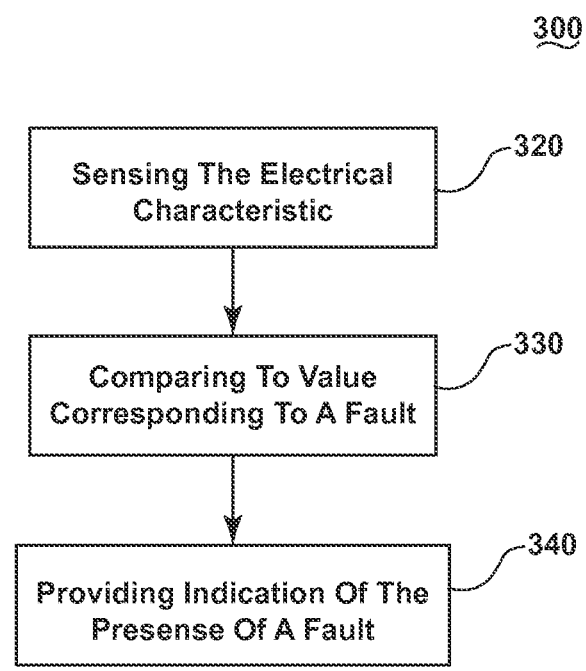
FIG. 8 is a flowchart of the method of detecting a fault in the conductor.

FIG. 8 illustrates an example flowchart showing the method 300 method of detecting a fault in the conductor and/or sheath. The method 300 begins with a sensing step 320 wherein the sensor 32 senses an electrical characteristic of the electricity passing through the conductive shield layer 26. Next, the method 300 performs a comparing step 330 wherein the controller 34 compares the sensed electrical characteristic to a threshold value corresponding to a fault.

The comparing step 330 can further include comparing the sensed electrical characteristic to at least one of a voltage, resistance, or current threshold value corresponding to a sheath 22 fault of at least one of the first or second electrical insulator layers 24, 28, and determining a sheath 22 fault of the at least one of the first or second electrical insulator layers 24, 28 occurs when the comparison is satisfied, as described above. For example, the controller 34 can receive the sensed electrical characteristic from the sensor 32, such as a voltage, and can convert the characteristic to a value into some other numerical form for indicating the characteristic. The characteristic and/or value can then be compared to a threshold value stored in memory of the controller 34 indicating a fault, via a computer program having an executable instruction set for determining if the comparison of the characteristic with the threshold value satisfies the threshold value. The term "satisfies" the threshold value is used herein to mean that the characteristic satisfies the predetermined threshold, such as being equal to or less than the threshold value. It will be understood that such a determination can easily be altered to be satisfied by a positive/negative comparison or a true/false comparison.

The computer program can include a computer program product that can include machine-readable media for carrying or having machine-executable instructions or data structures stored thereon. Such machine-readable media can be any available media, which can be accessed by a general purpose or special purpose computer or other machine with a controller 34. Generally, such a computer program can include routines, programs, objects, components, data structures, algorithms, etc., that have the technical effect of performing particular tasks or implement particular abstract data types. Machine-executable instructions, associated data structures, and programs represent examples of program code for executing the exchange of information as disclosed herein. Machine-executable instructions can include, for example, instructions and data, which cause a general purpose computer, special purpose computer, or special purpose processing machine to perform a certain function or group of functions.

In another example method 300, the comparing step 330 can further include comparing the sensed electrical characteristic to a high frequency threshold value corresponding to a series arc fault of the conductor 20, comparing the sensed electrical characteristic to a current threshold value corresponding to a series arc fault of the conductor 20, and/or comparing the sensed electrical characteristic to a voltage threshold value corresponding to a series arc fault of the conductor 20, and determining a series arc fault of the conductor 20 occurs when the comparison is satisfied.

Finally, the method 300 performs a providing step 340 wherein at least one of the controller 34 and/or fault detecting system 10 provides a fault indication when the comparison indicates the presence of a fault. The providing step 340 can further include, but is not limited to, providing the fault indication to an error logging system and logging the fault indication, providing the location of the fault indication to the error logging system and logging the location of the fault indication, ceasing transmission of any electrical signal passing through the conductor 20 in response to the providing the fault indication, and/or rerouting transmission of any electrical signal passing through the conductor 20 through an alternative conductor path in response to the providing the fault indication.

The sequence depicted is for illustrative purposes only and is not meant to limit the method 300 in any way as it is understood that the portions of the method 300 can proceed in a different logical order, additional or intervening portions can be included, or described portions of the method 300 can be divided into multiple portions, or described portions of the method can be omitted without detracting from the described method. For example, one embodiment of the method can include passing at least one of a power signal or data signal through the conductor 20 prior to the sensing step 320.

Many other possible embodiments and configurations in addition to that shown in the above figures can be included by the present disclosure. For example, one embodiment of the invention includes, but is not limited to, an ohmmeter for sensing a resistance of at least one of the conductor 20 and/or conductive shield layer 26, and comparing the sensed resistance against a resistance threshold value, in order to determine if an insulator breakdown 30, 36 and/or an arc fault 142 is or has occurred. Additionally, the design and placement of the various components can be rearranged such that a number of different in-line configurations could be realized.

The embodiments disclosed herein provide for an electrical fault detector for a circuit. The technical effect is that the above described embodiments enable the detection of electrical faults in a conductor or sheath encircling the conductor based on the sensing of an electrical characteristic of the conductive shield layer. One advantage that can be realized in the above embodiments is that the above described embodiments provide for active detection of insulator breakdown electrical faults in a sheath by detecting said faults before all insulating layers fail. By identifying insulator breakdown faults prior to complete insulator failure, electrical shorts to unintended grounded connections, thus reducing or eliminating any local heat generated by electrical fault events, which can lead to an electrical fire, smoke, melting of or damage to components, or catastrophic failures of the electrical system or greater structure, such as an aircraft.

Another advantage of the above described embodiments is that the electrical fault detector can detect an arc fault event, improving the electrical fault detection by detecting additional types of electrical faults. Moreover, in certain embodiments, wherein an electrical fault is between the fault detection circuit and another electrical component coupling the conductor with the conductive shield layer, the location of the fault can be positionally located between the aforementioned fault detection circuit and electrical component.

A fault detection circuit, and/or network of detection circuits in one or more electrical systems or logging systems can be able to precisely define where an electrical fault is taking place, providing maintenance personnel a limited amount of wiring to inspect for failures. Furthermore, precisely defining where an electrical fault is taking place reduces or eliminates any additional maintenance time and/or costs associated with having to manually test and locate the electrical failure. This can allow for a very robust system wherein fault events can be quickly located due to the proximity of one or more fault detectors to any given failure point. Additionally, by locating the point of failure, the system can allow for rerouting of power around the fault (if available), providing redundancy in the electrical network.

In yet another advantage of the above described embodiments is that the redundant insulator layers provide double the electrostatic protection of a single insulator layer to provide more robust defense against insulator breakdown due to cracking, tearing, and/or abrasion of the insulator. The additional protection provides an opportunity to detect a single layer failure and replace the sheath prior to complete failure of both insulator layers. The above described embodiments, thus, provide for increased safety for an electrical circuit such as an aircraft electrical power distribution system, and hence improve the overall safety of the circuit.

To the extent not already described, the different features and structures of the various embodiments can be used in combination with others as desired. That one feature cannot be illustrated in one or more of the embodiments is not meant to be construed that it cannot be, but is done for brevity of description. Thus, the various features of the different embodiments can be mixed and matched as desired to form new embodiments, whether or not the new embodiments are expressly described. Combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical fault detecting system comprising:
   a conductor passing an electrical signal from a source to a destination;
   a sheath encircling the conductor and including a conductive shield layer sandwiched between first and second electrical insulator layers, and connected with the conductor such that the conductive shield layer includes a reference signal electrical characteristic from the conductor; and
   a fault detection circuit electrically coupled with the conductive shield layer;
   wherein the fault detection circuit is configured to detect a fault by way of detecting a change in the reference signal electrical characteristics of the conductive shield layer.

2. The fault detecting system of claim 1 wherein the fault detection circuit comprises a sensor electrically coupled with the conductive shield layer and senses the electrical characteristic of the energized conductive shield layer.

3. The fault detecting system of claim 2 wherein the fault detection circuit further comprising a controller in communication with the sensor and configured to provide at least one of a comparison of the sensed electrical characteristic, an indication of a comparison of the sensed electrical characteristic, or control at least one function in response to a comparison of the sensed electrical characteristic.

4. The fault detecting system of claim 3 wherein the controller further comprises at electrical characteristic threshold value stored in memory, wherein the controller compares the sensed characteristic to the characteristic threshold value.

5. The fault detecting system of claim 4 wherein the electrical characteristic threshold value further comprises at least one of a resistance threshold value, a current threshold value, and a voltage threshold value.

6. The fault detecting system of claim 1 wherein the source is the fault detection circuit.

7. The fault detecting system of claim 1 wherein the source comprises the conductor having a resistive element electrically coupling the conductor with conductive shield layer away from the fault detection circuit, wherein the resistive element enables energization of the conductive shield layer.

8. The fault detecting system of claim 1 wherein the source further comprises the conductor having a capacitor electrically coupling the conductor with the conductive shield layer away from the fault detection circuit.

9. The fault detecting system of claim 3 further comprising an error logging system in communication with the controller, and wherein the error logging system is configured to log an error when a fault is detected.

10. An electrical fault detector for an electrical conductor, comprising:
    a sheath encircling the conductor and including a conductive shield sandwiched between first and second insulated layers, the conductive shield connected with and energized by the conductor such that the conductive shield layer includes a reference signal electrical characteristic from the conductor;
    a sensor configured to electrically couple to the shield and output a signal corresponding to an electrical characteristic of electricity passing through the shield; and
    a controller electrically coupled to the sensor to receive the signal and having a memory in which is stored a threshold value for the sensed electrical characteristic, wherein the controller is configured to compare the signal to the reference signal electrical characteristic and provide an indication when the comparison indicates a fault when the comparison indicates a change in the reference signal electrical characteristic of the conductive shield layer.

11. A method of detecting a fault in a conductor having an encircling sheath include a shield sandwiched between first and second electrical insulator layers, the conductor electrically connected with the shield, the shield biased to a biased electrical characteristic by the conductor, the method comprising:
    sensing a present electrical characteristic of electricity from the conductor passing through the shield;
    comparing the sensed present electrical characteristic to the biased electrical characteristic to determine if a fault is present based on detecting a change in the present electrical characteristic from the biased electrical characteristic; and
    providing a fault indication when the comparison indicates the presence of a fault.

12. The method of claim 11 wherein the comparing further comprises comparing the sensed electrical characteristic to at least one of a voltage, resistance, or current threshold value corresponding to a sheath fault of at least one of the first or second electrical insulator layers, and determining a sheath fault of the at least one of the first or second electrical insulator layers occurs when the comparison is satisfied.

13. The method of claim 11 wherein the providing further comprises providing the fault indication to an error logging system and logging the fault indication.

14. The method of claim 13 further comprising providing the location of the fault indication to the error logging system and logging the location of the fault indication.

15. The method of claim 11 further comprising ceasing transmission of any electrical signal passing through the conductor in response to the providing the fault indication.

16. The method of claim 11 further comprising passing at least one of a power signal or data signal through the conductor prior to the sensing.

17. The method of claim 11 wherein the comparing further comprises comparing the sensed electrical characteristic to a high frequency threshold value corresponding to a series arc fault of the conductor, and determining a series arc fault of the conductor occurs when the comparison is satisfied.

18. The method of claim 11 wherein the comparing further comprises comparing the sensed electrical characteristic to a current threshold value corresponding to a series arc fault of the conductor, and determining a series arc fault of the conductor occurs when the comparison is satisfied.

19. The method of claim 11 wherein the comparing further comprises comparing the sensed electrical characteristic to a voltage threshold value corresponding to a series arc fault of the conductor, and determining a series arc fault of the conductor occurs when the comparison is satisfied.

20. The method of claim 11 further comprising rerouting transmission of any electrical signal passing through the conductor, through an alternative conductor path, in response to the providing the fault indication.

* * * * *